United States Patent
Huang et al.

(10) Patent No.: US 11,322,638 B2
(45) Date of Patent: May 3, 2022

(54) WAVEGUIDE-INTEGRATED AVALANCHE PHOTODIODE

(71) Applicant: SiFotonics Technologies Co., Ltd., Grand Cayman (KY)

(72) Inventors: Mengyuan Huang, Redmond, WA (US); Tzung-I Su, Taoyuan (TW); Te-huang Chiu, Hsinchu (TW); Zuoxi Li, Beijing (CN); Ching-yin Hong, Lexington, MA (US); Dong Pan, Andover, MA (US)

(73) Assignee: SiFotonics Technologies Co., Ltd.

( * ) Notice: Subject to any disclaimer, the term of this patent is extended or adjusted under 35 U.S.C. 154(b) by 97 days.

(21) Appl. No.: 16/705,755

(22) Filed: Dec. 6, 2019

(65) Prior Publication Data

US 2020/0185561 A1    Jun. 11, 2020

Related U.S. Application Data

(60) Provisional application No. 62/917,395, filed on Dec. 6, 2018.

(51) Int. Cl.
*H01L 31/107*    (2006.01)
*H01L 31/0288*   (2006.01)
*H01L 31/0312*   (2006.01)
*H01L 31/0232*   (2014.01)

(52) U.S. Cl.
CPC ...... *H01L 31/1075* (2013.01); *H01L 31/0288* (2013.01); *H01L 31/02327* (2013.01); *H01L 31/0312* (2013.01); *H01L 31/107* (2013.01)

(58) Field of Classification Search
CPC ............ H01L 31/1075; H01L 31/0288; H01L 31/0312; H01L 31/02327; H01L 31/107; H01L 29/66113; H01L 29/7886; G02B 6/34

See application file for complete search history.

(56) References Cited

U.S. PATENT DOCUMENTS

| 4,952,791 | A  | * | 8/1990  | Hinton | G02F 3/028 250/214 LS |
| 5,451,767 | A  | * | 9/1995  | Amano  | B82Y 20/00 250/214.1 |
| 2002/0195616 | A1 | * | 12/2002 | Bond   | H01L 31/1075 257/186 |
| 2007/0152289 | A1 | * | 7/2007  | Morse  | H01L 31/028 257/431 |

(Continued)

*Primary Examiner* — Bitew A Dinke
(74) *Attorney, Agent, or Firm* — Han IP PLLC; Andy M. Han

(57) ABSTRACT

Various embodiments of a monolithic avalanche photodiode (APD) are described, which may be fabricated on a silicon-on-insulator substrate. The monolithic APD includes an optical waveguide that guides an incident light to an active region of the APD. An optical coupler is integrally formed with the optical waveguide to capture the incident light. The monolithic APD also includes an optical reflector to reflect a portion of the incident light that is not readily captured by the optical coupler back to the optical coupler for further capturing. The active region includes an absorption layer for converting the incident light into a photocurrent, an epitaxial structure for amplifying the photocurrent by avalanche multiplication, as well as a pair of electrical conductors for conducting the amplified photocurrent.

19 Claims, 7 Drawing Sheets

(56) References Cited

U.S. PATENT DOCUMENTS

| | | | |
|---|---|---|---|
| 2012/0326259 A1* | 12/2012 | Huang | H01L 31/1075 257/438 |
| 2013/0292741 A1* | 11/2013 | Huang | H01L 31/1075 257/186 |
| 2014/0239301 A1* | 8/2014 | Huang | H01L 31/02327 257/53 |
| 2014/0291682 A1* | 10/2014 | Huang | H01L 31/1075 257/55 |
| 2015/0028443 A1* | 1/2015 | Shi | H01L 31/1075 257/438 |
| 2016/0254407 A1* | 9/2016 | Wang | H01L 31/107 136/256 |
| 2016/0308075 A1* | 10/2016 | Wang | H01L 31/02325 |
| 2017/0271529 A1* | 9/2017 | Tan | H01L 31/035281 |
| 2018/0102442 A1* | 4/2018 | Wang | H01L 31/02 |
| 2018/0180805 A1* | 6/2018 | Huang | G02B 6/122 |
| 2018/0219120 A1* | 8/2018 | Huang | G02B 6/12004 |

\* cited by examiner

WAVEGUIDE-INTEGRATED AVALANCHE PHOTODIODE

CROSS-REFERENCE TO RELATED PATENT APPLICATIONS

The present disclosure claims the priority benefit of U.S. Patent Application No. 62/917,395, filed on Dec. 6, 2018. The aforementioned application is incorporated by reference in its entirety.

TECHNICAL FIELD

The present disclosure relates to the technical field of photodiodes. More particularly, the present disclosure relates to a monolithic avalanche photodiode having an optical waveguide integrated thereon.

BACKGROUND

A photodiode, such as an avalanche photodiode (APD), is a key component in various modern digital communication systems. An APD is a semiconductor optoelectrical device that converts light into an electrical current, which is referred as "photocurrent". An APD is often monolithically fabricated on a substrate. The substrate is usually a semiconductor substrate such as a silicon (Si) or silicon-on-insulator (SOI) substrate, on which the monolithic APD is fabricated using fabrication techniques similar to those employed in manufacturing semiconductor integrated circuits (ICs). The monolithic APD is suitable to be integrated with various other miniaturized optical components, such as waveguides, optical couplers, optical splitters, and/or phase shifters, to form a monolithic photonic system.

A key performance index (KPI) of an APD is its responsivity, i.e., a ratio of the generated photocurrent to the power of the incident light. A high responsivity is preferred, as an APD having a high responsivity is able to generate more photocurrent from a certain amount of optical power in the incident light. The responsivity of an APD is affected by two factors: a coupling loss and an internal leakage current. The internal leakage current is sometimes referred as a "dark current" of the APD. A higher coupling loss means a smaller percentage of the incident optical power actually reaches an active area of the APD, and thus is undesired. A higher dark current is also undesired, as the dark current represents a noise source to the "signal", i.e., the photocurrent, and a higher signal-to-noise ratio (SNR) is generally desired from a system's point of view. Therefore, a low coupling loss and a low leakage current are key to achieving an APD with desired performance.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter. The left-most digit(s) of a reference number identifies the figure in which the reference number first appears. The use of the same reference numbers in different figures indicates similar or identical items.

DETAILED DESCRIPTION OF THE PREFERRED EMBODIMENTS

In the following detailed description, numerous specific details are set forth by way of examples in order to provide a thorough understanding of the relevant teachings. Any variations, derivatives and/or extensions based on teachings described herein are within the protective scope of the present disclosure. In some instances, well-known methods, procedures, components, and/or circuitry pertaining to one or more example implementations disclosed herein may be described at a relatively high level without detail, in order to avoid unnecessarily obscuring aspects of teachings of the present disclosure.

As described above, a low coupling loss and a low leakage current are desired for a monolithic avalanche photodiode (APD). The various embodiments of monolithic APDs described herein are capable of reducing the coupling loss of the incident light, as well as reducing the dark current inside the device.

Figure 1:
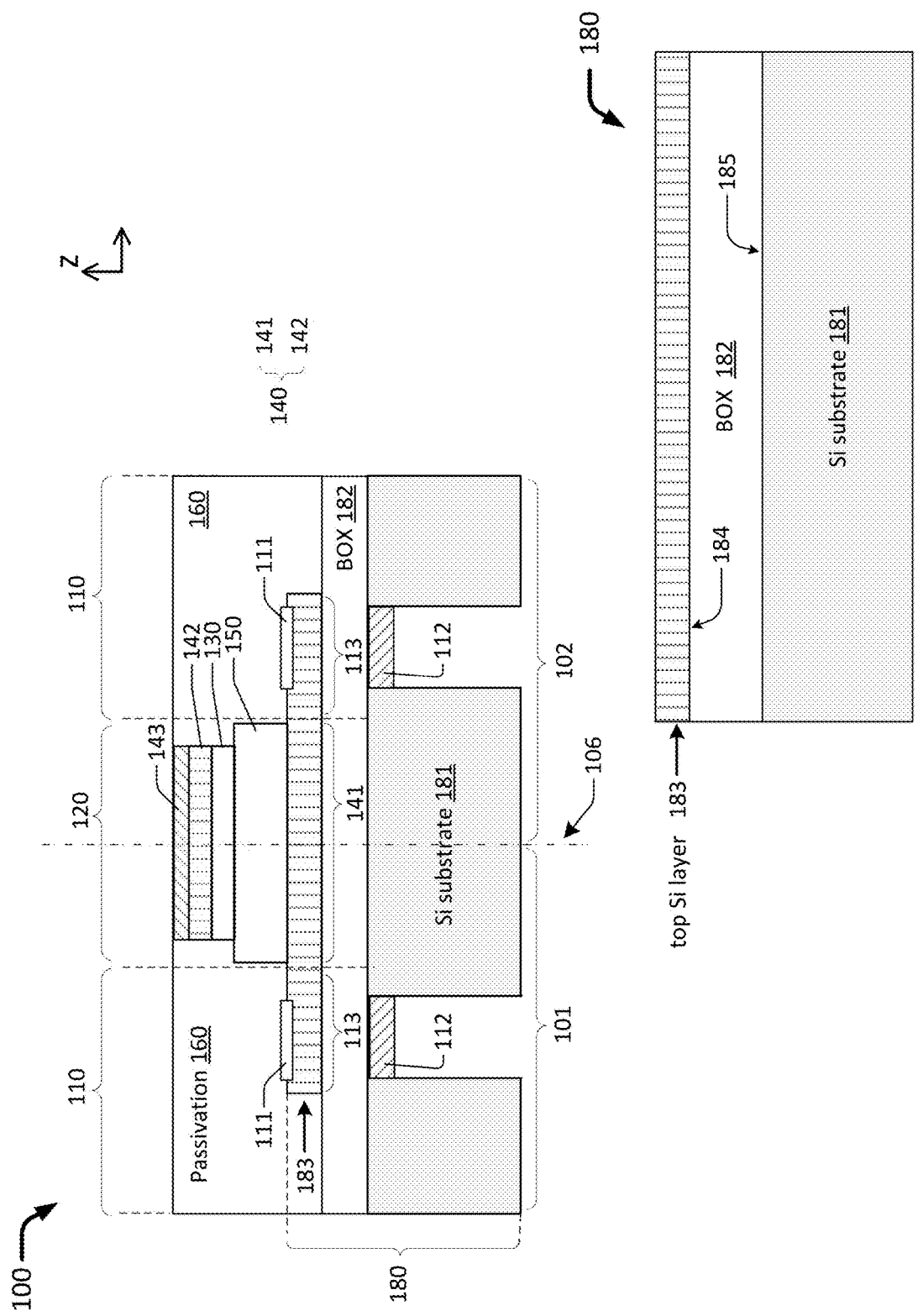
FIG. 1 illustrates a cross-sectional view of a monolithic avalanche photodiode (APD) in accordance with an embodiment of the present disclosure.
Figure 2:
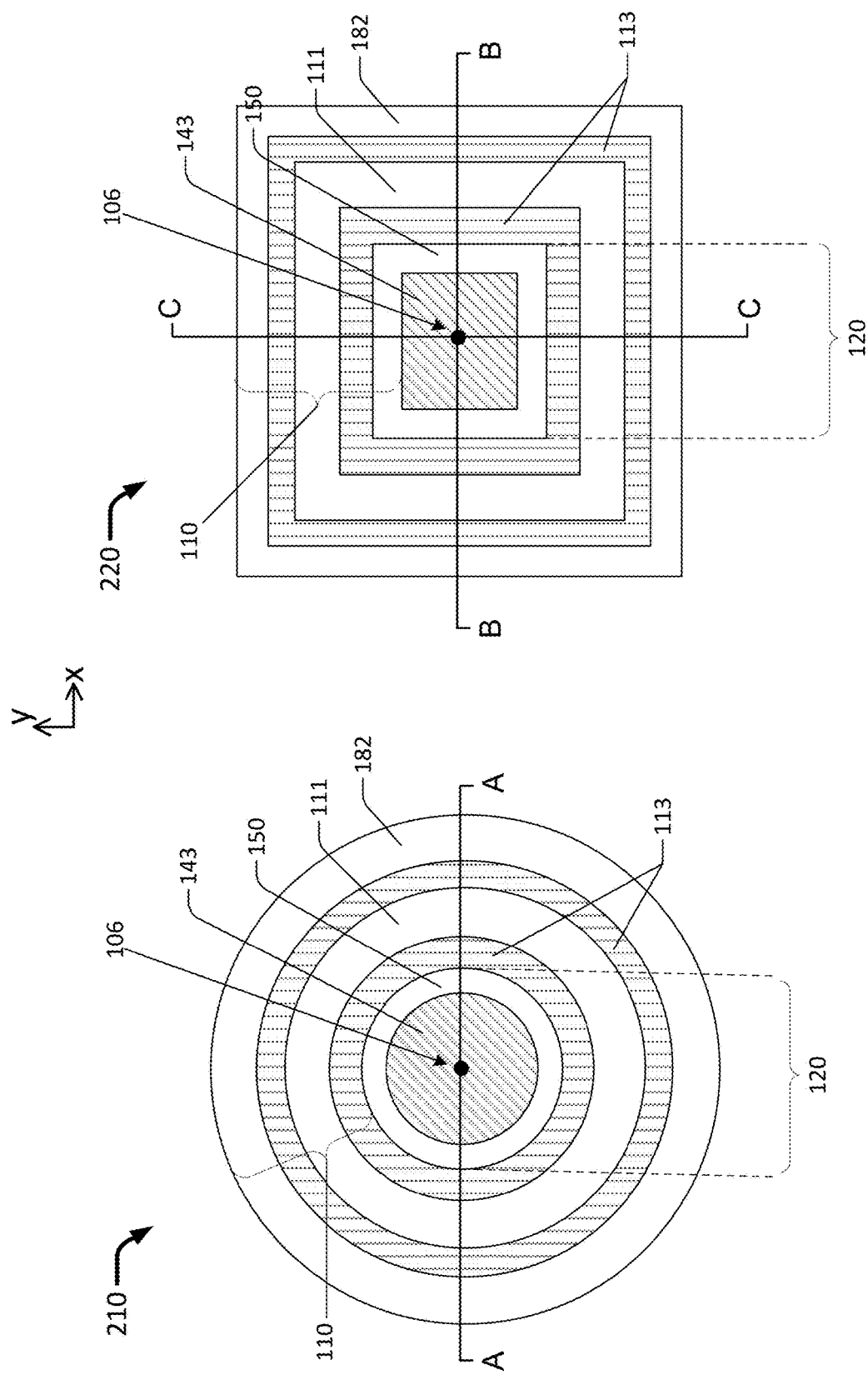
FIG. 2 illustrates example top views of the monolithic APD of FIG. 1.

FIG. 1 illustrates a cross-sectional view of an example APD 100, as well as a cross-sectional view of an SOI substrate 180 on which the APD 100 is monolithically built. The cross sections shown in FIG. 1 are in parallel with the z-axis of a Cartesian coordinate system. The APD 100 may have a cross section of a round or rectangular shape on a plane that is perpendicular to the z-axis. FIG. 2 illustrates two example top views 210 and 220 of the APD 100, wherein the top views 210 and 220 are viewed along the z-axis. Namely, the top views 210 and 220 are parallel to the x-y plane of the Cartesian coordinate system. The cross-sectional view of the APD 100 as shown in FIG. 1 may reveal a cross section along either line A-A, B-B, or C-C of FIG. 2. The APD 100 is configured to receive an incident light that substantially comes along the z-axis. The z-axis is hereinafter interchangeably referred as the "vertical direction" of the APD 100. The APD 100 is geometrically symmetrical with respect to a center line 106, which extends along the vertical direction. Due to the symmetry, the APD 100 can be divided into two mirrored halves 101 and 102 in the cross-sectional view of FIG. 1. The halves 101 and 102 of APD 100 are identical to one another and are symmetrical with respect to the center line 106. The center line 106 is located at a geometrical center of each of the top views 210 and 220.

The APD 100 may be fabricated on a silicon-on-insulator (SOI) substrate using a process that is similar to, or compatible with, a complementary-metal-oxide-semiconductor (CMOS) fabrication process. FIG. 1 includes a cross-sectional view of a SOI substrate 180 before an APD, such as the APD 100, is fabricated thereon. As shown in FIG. 1, the SOI substrate 180 comprises three different layers of material: a bulk silicon substrate 181, a top silicon layer 183, and a buried oxide (BOX) layer 182, wherein the BOX layer 182 is disposed between the bulk silicon substrate 181 and the top silicon layer 183. Namely, the top silicon layer 183 and the bulk silicon substrate 181 are disposed respectively on two opposite sides of the BOX layer 182. The BOX layer 182 has two opposing surfaces: an upper surface 184 and a lower surface 185. The top silicon layer 183 meets the BOX layer 182 at the upper surface 184, whereas the bulk silicon substrate 181 meets the BOX layer 182 at the lower surface 185. As described above, the top silicon layer 183 typically has a thickness in the z-direction that is significantly smaller than that of the bulk silicon substrate 181. Both the bulk silicon substrate 181 and the top silicon layer 183 is made of silicon (Si), whereas the BOX layer 182 is made of silicon dioxide ($SiO_2$). To provide a solid insulation to the devices fabricated in the top silicon layer 183, the BOX layer 182 is typically much thicker than the top silicon layer 183. In some embodiment, the top silicon layer 183 has a thickness in a range of 150-400 nanometers (nm), whereas the BOX layer has a thickness in a range of 1000-4000 nm.

As shown in FIG. 1 and FIG. 2, the APD 100 includes two zones: an optical zone 110 and an optoelectrical zone 120. The optical zone 110 includes components via which an incident light is at least partially collected and conveyed to the optoelectrical zone 120. The optoelectrical zone 120 includes components via which the optical power of the incident light, as captured by and delivered from the optical zone 110, is converted to an electrical current (hereinafter referred as a "photocurrent"). The optoelectrical zone 120 is hereinafter interchangeably referred as "the active region" of the APD 100 because it is where the optical power is converted to the photocurrent.

Specifically, the optical zone 110 includes an optical coupler 111, an optical reflector 112, and an optical waveguide 113. The optical coupler 111 is capable of receiving the incident light, and the optical reflector 112 is capable of reflecting at least a portion of the incident light to the optical coupler 111. The optical waveguide 113 is capable of guiding the incident light received by the optical coupler 111 to the optoelectrical zone 120.

The optoelectrical zone 120 includes an absorption layer 130, an epitaxial structure150, and a pair of electrical conductors 140. The absorption layer 130 is capable of converting the incident light into a photocurrent. The epitaxial structure 150 is capable of amplifying the photocurrent generated by the absorption layer 130 into an amplified photocurrent via a process of avalanche multiplication. The pair of electrical conductors 140 includes a conductor 141 and a conductor 142, which are capable of conducting the amplified photocurrent. The photocurrent can flow out of the APD 100 via a top metal layer 143 that is electrically coupled to either the conductor 141 or the conductor 142. The APD 100 also includes a passivation 160 that covers the optical zone 110 and the optoelectrical zone 120 on a top side of the APD 100 that is exposed to the incident light. The passivation 160 is made of a material that is substantially transparent to the incident light. For illustration purposes the passivation 160 is not shown in the top views of FIG. 2.

Figure 3:
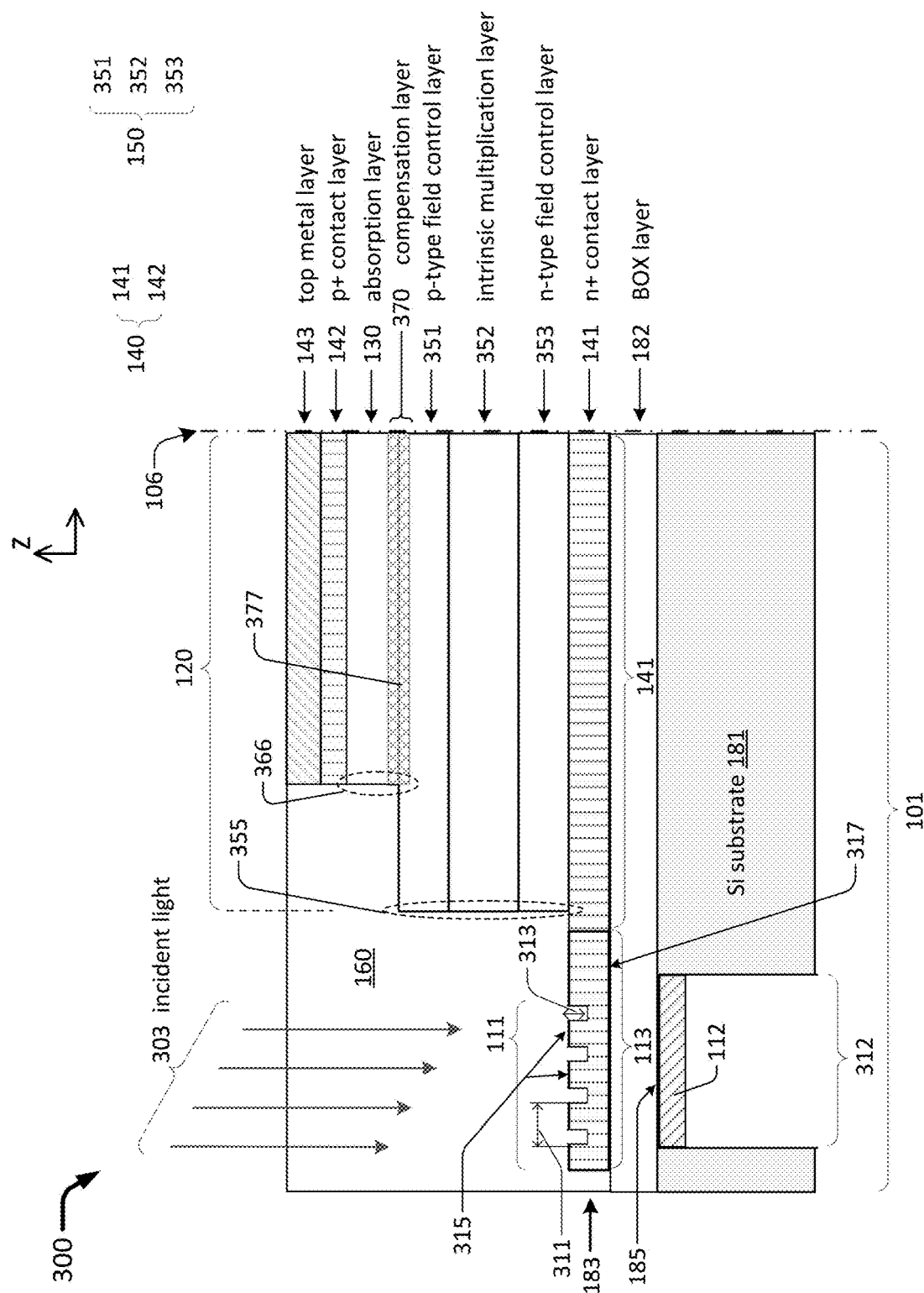
FIG. 3 illustrates a cross-sectional view of half of a monolithic APD in accordance with an embodiment of the present disclosure.

FIG. 3 illustrates an embodiment 300 of the APD 100. Specifically, FIG. 3 illustrates a cross-sectional view of the half 101 of the APD 100 according to the embodiment 300. As shown in FIG. 3, the APD 100 is configured to receive an incident light 303 that shines upon the APD 100 along the z-direction. The incident light 303 may come from free space, or from an optical conduit such as an optical waveguide or an optical fiber. The incident light 303 travels through the passivation 160 to arrive at the optical coupler 111, where at least a portion of the incident light 303 is captured by the optical coupler 111. The optical coupler 111 may be integrally formed on the optical waveguide 113, which is capable of guiding the incident light 303 received by the optical coupler 111 to the active region 120 of the APD 100. The optical waveguide 113 has an upper surface 315, as well as a lower surface 317 opposes the upper surface 315. The upper surface 315 faces the incident light 303, and the optical coupler 111 is integrally formed on the upper surface 315 of the optical waveguide 113.

The optical coupler 111 is capable of receiving the incident light 303, which arrives at the optical coupler 111 along the z-axis. Specifically, the optical coupler 111 is capable of capturing or otherwise coupling a portion of the incident light 303 into the optical waveguide 113. The incident light 303 subsequently travels within the optical waveguide 113 to the active region 120. In some embodiments, the optical coupler 111 may be an optical grating, which has a periodic structure that is defined by a few geometric parameters, such as a grating pitch 311 and a grating depth 313. The geometric parameters may be designed variously to capture the incident light 303 of various wavelengths.

A portion of the incident light 303 that is not readily captured by the optical coupler 111 at a first pass travels past the optical waveguide 113 in the vertical direction and arrives at the optical reflector 112, which is disposed below the optical coupler 111. The optical reflector 112 is capable of reflecting at least a portion of the incident light 303 that travels past the optical waveguide 113 back to the optical coupler 111 so that more of the incident light 303 can be coupled to the optical waveguide 113 by the optical coupler 111. The optical reflector 112 may have a larger dimension in the x-y plane than that of the optical coupler 111 to reflect the light effectively. Without the optical reflector 112, the portion of the incident light 303 that travels past the optical waveguide 113 at a first pass would have been lost in the silicon substrate 181, as the silicon substrate 181 has a low reflectivity for the incident light 303, at least for the incident light 303 that has a wavelength used by commercial optical communication, i.e., within a range of 1260-1600 nm.

As shown in FIG. 3, the optical reflector 112 is disposed below the lower surface 317 of the optical waveguide 113. Specifically, the optical reflector 112 is separated from the lower surface 317 by the BOX layer 182. The optical reflector 112 may be disposed by firstly forming a hole or well 312 in a backside of silicon substrate 181. The well 312 may be formed using selective etching techniques so that the etching of the silicon substrate 181 stops at the lower surface 185 of the BOX layer 182, thereby forming the well 312. A highly reflective material can be subsequently deposited into the well 312 to form the optical reflector 112. The highly reflective material that forms the optical reflector 112 may be aluminum (Al), copper (Cu), aluminum-copper (AlCu) alloy, or other reflective material that is compatible to the CMOS fabrication process for realizing the APD 100.

In the embodiment 300, the optical waveguide 113 is formed in the top silicon layer 183 of the SOI substrate 180. Thus, the thickness of the optical waveguide 113 is the same as the thickness of the top silicon layer 183. The portion of the top silicon layer 183 that the optical waveguide 113 is made of may be undoped silicon. The grating depth 313 of the optical coupler 111 is smaller than the thickness of the top silicon layer 183. In the embodiment 300, the thickness of the top silicon layer 183 may be in a range of 150-400 nm, and the grating depth 313 may be in a range of 20-200 nm, whereas the grating pitch 311 may be in a range of 50-500 nm.

The active region 120 is disposed lateral to the optical waveguide 113 along a horizontal direction. The horizontal direction is substantially orthogonal to the z-axis, as shown in FIG. 1 and FIG. 3. That is, as shown in the top views of FIG. 2, the horizontal direction is substantially in parallel with the x-y plane. That is, the horizontal direction is substantially orthogonal to the vertical direction.

As shown in FIG. 3, the active region 120 includes multiple layers, such as the absorption layer 130, that comprise various materials and have various thicknesses. A thickness of a layer thereof is defined by a dimension of the layer along the z-axis. Each of the layers extends in the x-y plane. As mentioned elsewhere herein, the absorption layer 130 is capable of converting the incident light 303, as received by the optical coupler 111 and guided to the active region 120 by the optical waveguide 113, into a photocurrent. In various embodiments, the absorption layer 130 may be made of silicon-germanium (SiGe) alloy, silicon-germanium-carbon (SiGeC) alloy, or intrinsic germanium (Ge). For example, the absorption layer 130 may be a layer of intrinsic germanium with a thickness in a range of 100-700 nm in the vertical direction. The intrinsic germanium has a carrier concentration in a range of 5e14-5e16 per cubic centimeter ($cm^{-3}$). As shown in FIG. 3, the absorption layer 130 is disposed adjacent to the epitaxial structure 150 in the vertical direction.

The epitaxial structure 150 has three layers extending in the x-y plane: a p-type field control layer 351, a n-type field control layer 353, and an intrinsic multiplication layer 352. The three layers are adjacent to each other in the vertical direction, with the intrinsic multiplication layer 352 disposed between the p-type field control layer 351 and the n-type field control layer 353. As mentioned elsewhere herein, the epitaxial structure 150 is capable of amplifying the photocurrent generated in the absorption layer 130 by a process of avalanche multiplication.

The epitaxial structure 150 may be made from silicon that is deposited on top of the top silicon layer 183 of the SOI substrate 180 by a chemical vapor deposition process or other deposition processes. The intrinsic multiplication layer 352 comprises undoped, intrinsic silicon, which has a carrier concentration in a range of 5e14-5e16 $cm^{-3}$. The n-type field control layer 353 comprises silicon doped with a n-type dopant such as arsenic (As) or phosphorus (P), whereas the p-type field control layer 351 comprises silicon doped with a p-type dopant such as boron (B). The n-type field control layer 353 may have a doping concentration in a range of 2e17-5e18 $cm^{-3}$, and the p-type field control layer 351 may have a doping concentration in a range of 8e16-2e18 $cm^{-3}$. In the embodiment 300, the intrinsic multiplication layer 352 may have a thickness in a range of 50-400 nm, the n-type field control layer 353 may have a thickness in a range of 100-400 nm., and the p-type field control layer 353 may have a thickness in a range of 30-300 nm.

The active region 120 further includes a p+ contact layer, which embodies the conductor 142, and a n+ contact layer, which embodies the conductor 143. The absorption layer 130 and the epitaxial structure 150 are disposed between the n+ contact layer 141 and the p+ contact layer 142. Both the n+ contact layer 141 and the p+ contact layer 142 are heavily doped silicon, wherein the higher doping concentration thereof provides adequate conductivity for conducting the photocurrent generated by the epitaxial structure 150. For example, the n+ contact layer 141 may have a doping concentration in a range of 5e18-5e19 $cm^{-3}$, and the p+ contact layer 142 may have a doping concentration in a range of 5e18-5e19 $cm^{-3}$. The p+ contact layer 142 and the n+ contact layer 141 are doped using the same dopants that dopes the p-type field control layer 351 and n-type field control layer 353, respectively.

In the embodiment 300, the n+ contact layer 141 is formed in the top silicon layer 183 of the SOI substrate 180, so the thickness of the n+ contact layer 141 is the same as that of in the top silicon layer 183, which is also the same as that of the optical waveguide 113, i.e., in a range of 150-400 nm. The n+ contact layer 141 is disposed adjacent to the n-type field control layer 353. Although doped at different doping levels, both the n+ contact layer 141 and the n-type field control layer 353 are made of crystalline silicon, and thus share the same lattice constant. So a relatively thick silicon crystal can be grown over the n+ contact layer 141 to provide the material for making the epitaxial structure 150. On the other hand, the p+ contact layer 142 is disposed adjacent to the absorption layer 130, which is made of Ge, SiGe, or SiGeC and thus has a different lattice constant than that of crystalline silicon. For example, germanium and silicon has a 4.2% lattice mismatch. Therefore, the p+ contact layer 142 comprises amorphous silicon (a-Si) rather than crystalline silicon, and is relatively thinner as compared to n+ contact layer 141. For example, the p+ contact layer 142 may comprise a-Si with a thickness in a range of 50-200 nm.

In embodiment 300, the absorption layer 130 is disposed adjacent to the p-type field control layer 351 of the epitaxial structure 150. An interface 377 is shown in FIG. 3 indicating the interface between the absorption layer 130 and the p-type field control layer 351. Due to the lattice mismatch between the absorption layer 130 and the p-type field control layer 351, a higher concentration of defect states is present at the interface 377, which adversely affects various performance indicators of the APD 100, such as spectral responsivity and/or quantum efficiency. In some embodiments, the active region 120 includes a compensation layer 370 around the interface 377. The compensation layer 370 encompasses a region slightly above and below the interface 377. Specifically, the compensation layer 370 receives additional doping of n-type dopants to compensate for the defect states, thereby reducing the concentration of the defect states at the interface 377.

Also included in the embodiment 300 is the passivation 160. As shown in FIG. 3, the passivation 160 covers the upper surface 315 of the optical waveguide 113. Moreover, the passivation 160 covers a sidewall 355 of the epitaxial structure 150 as well as a sidewall 366 of the absorption layer 130. Given that the passivation 160 comprises $SiO_2$, which exhibits few defects in the CMOS process, a density of dangling bonds presented on the sidewalls 355 and 366 is therefore reduced with the sidewalls 355 and 366 covered by the passivation 160. A high density of dangling bonds on the sidewalls 355 and 366 would have caused an extra leakage current in the APD 100, which adversely affects the performance of the APD 100.

Figure 4:
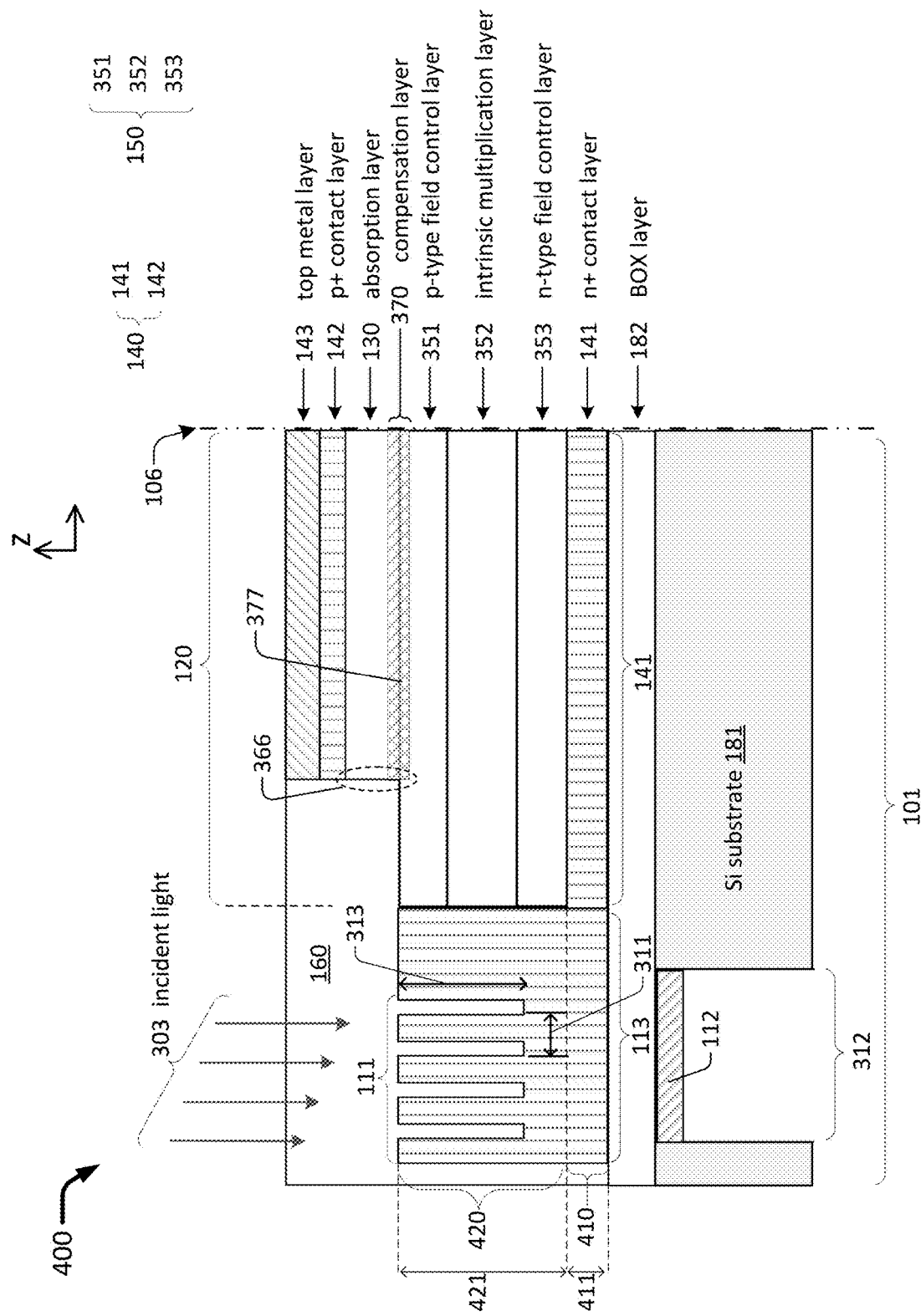
FIG. 4 illustrates a cross-sectional view of half of a monolithic APD in accordance with another embodiment of the present disclosure.

FIG. 4 illustrates another embodiment 400 of the APD 100. Similar to FIG. 3, FIG. 4 illustrates a cross-sectional view of the half 101 of the APD 100 according to the embodiment 400. The difference between the embodiment 300 and the embodiment 400 resides in that the optical waveguide 113 of the embodiment 400 is thicker. Specifically, in embodiment 400, the optical waveguide 133 has a thickness that is substantially equal to a sum of a thickness 411 of the top silicon layer 183 and a thickness 421 of the epitaxial structure 150. As shown in FIG. 4, the optical coupler 133 is formed by two parts: a first part 410 that is formed in the top silicon layer 183 of the SOI substrate 180, and a second part 420 that may be deposited on top of the top silicon layer 183 together with the epitaxial structure 150. Thanks to the higher thickness of the optical waveguide 113, the optical coupler 111 is allowed to have a larger depth 313 as compared to that of the embodiment 300. For example, for the embodiment 400, the grating depth 313 may be in a range of 50-500 nm, whereas the grating pitch 311 may be in a range of 200-1000 nm. In short, the higher thickness of the optical waveguide 113 enables more flexibility in choosing the geometric parameters of the optical coupler 111, and thus the optical coupler 111 may be better optimized for various grating performances.

It is also worth noting that, the sidewall 355 no longer exists in the embodiment 400, as the optical waveguide 113 and the epitaxial structure 150 are simultaneously deposited on top of the top silicon layer 183 of the SOI substrate 180. Namely, the embodiment 400 substantially eliminates the dangling bonds that are present on the sidewall 355 of the embodiment 300, thereby eliminating a path of the leakage current that would have existed along the sidewall 355. The sidewall 366 is still covered by the passivation 160 in the embodiment 400.

In some other embodiments, the optical waveguide 113 may have a thickness that is between that of the embodiment 300 and that of the embodiment 400. Namely, the thickness of the optical waveguide 113 may be more than the thickness 411 but less than a sum of the thickness 411 and the thickness 421. This provides further flexibility for designing the dimensions of the optical waveguide 113 and/or the optical coupler 111. Any portion of the sidewall 355 that is not adjacent to the waveguide 113 is covered by the silicon dioxide passivation 160.

Figure 5:
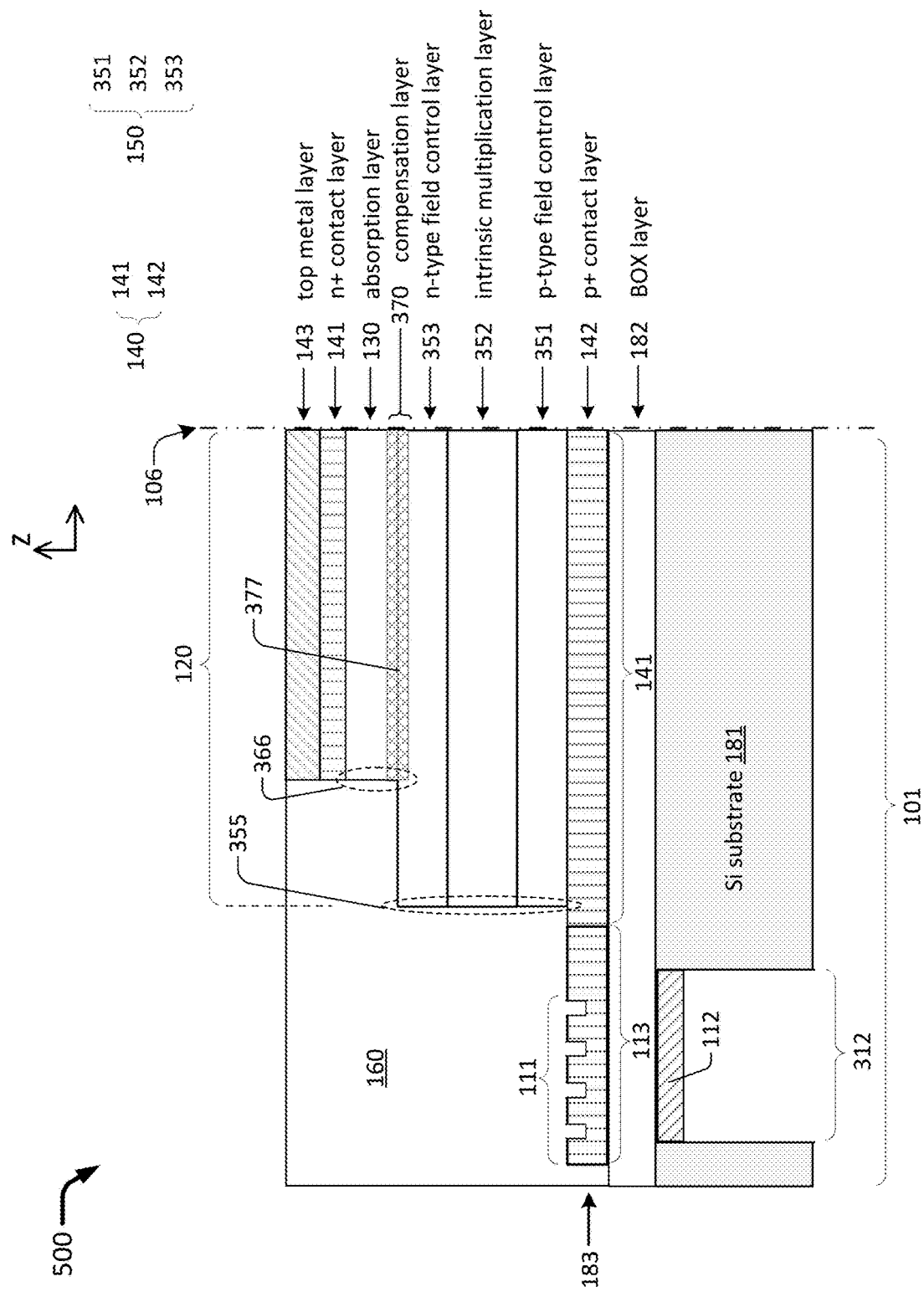
FIG. 5 illustrates a cross-sectional view of half of a monolithic APD in accordance with yet another embodiment of the present disclosure.

FIG. 5 illustrates yet another embodiment 500 of the APD 100. Similar to FIG. 3 and FIG. 4, FIG. 5 illustrates a cross-sectional view of the half 101 of the APD 100 according to the embodiment 500. The difference between the embodiment 500 and the embodiment 300 resides in that the locations of the p-type field control layer 351 and the n-type field control layer 353 are swapped, as well as the locations of the n+ contact layer 141 and the p+ contact layer 142. Namely, the p+ contact layer 142 is formed in the top silicon layer 183 of the SOI substrate 180, and the n+ contact layer 141 is now adjacent to the absorption layer 130. In addition, the p-type field control layer 351 is adjacent to the p+ contact layer 142, whereas the n-type field control layer 353 is adjacent to the absorption layer 130. In addition, the thickness and the crystalline condition of the p+ contact layer 142 and the n+ contact layer 141 are different than those in the embodiment 300. The p+ contact layer 142, now formed in the top silicon layer 183, comprises crystalline silicon, and has a thickness in a range of 150-400 nm. The n+ contact layer 142, now being formed adjacent to the absorption layer 130, comprises amorphous silicon, and has a thickness in a range of 50-200 nm. Nonetheless, the compensation layer 370 of the embodiment 500 is doped same as that of the embodiment 300. Namely, the compensation layer 370 of the embodiment 500 receives n-type dopants to compensate for the effective defect states at the interface 377.

Figure 6:
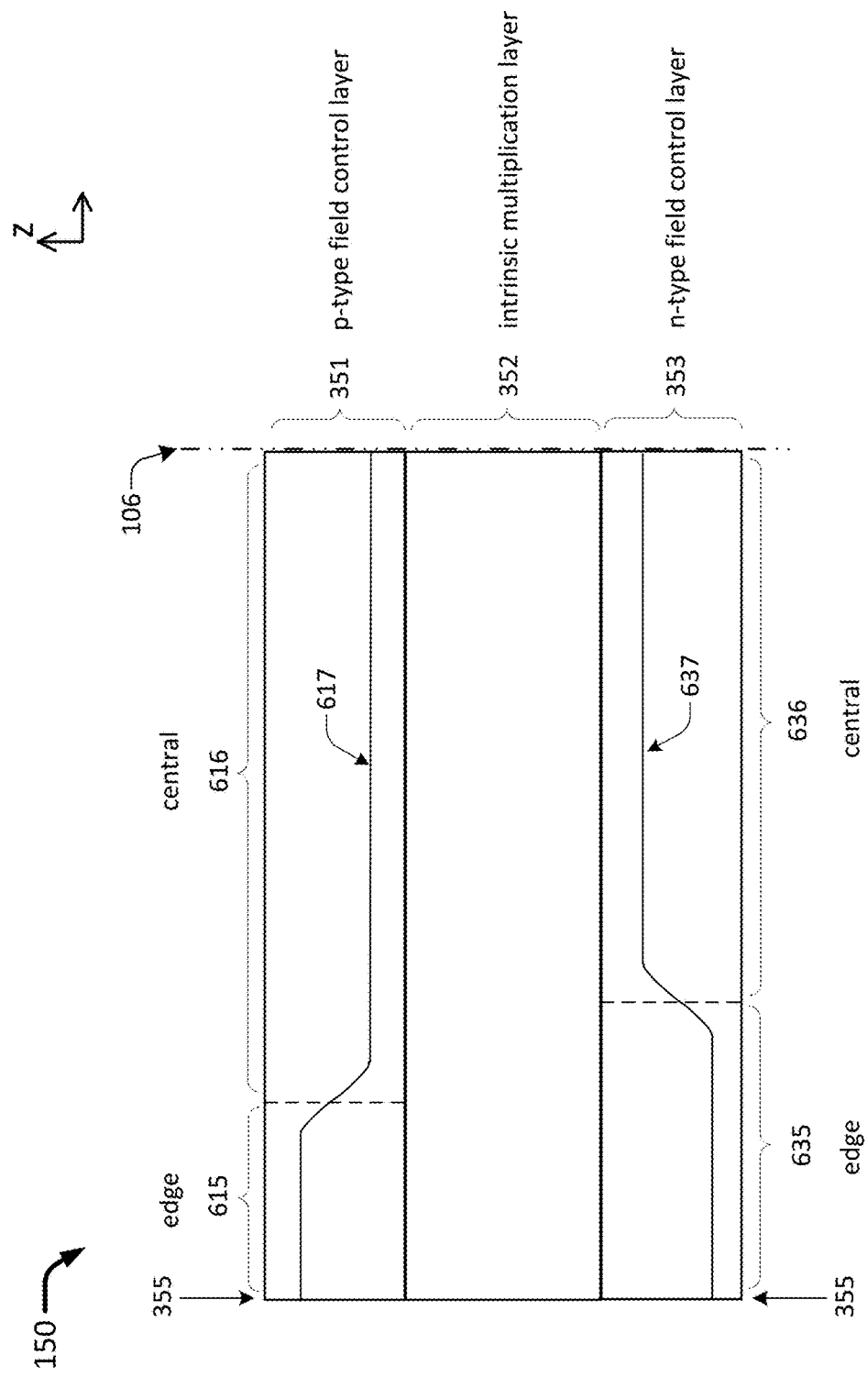
FIG. 6 illustrates a diode doping profile of a monolithic APD in accordance with an embodiment of the present disclosure.

In some embodiments, either or both of the p-type field control layer 351 and the n-type field control layer 353 may have a doping profile that is not uniform. FIG. 6 illustrates example doping profiles 617 and 637 of the p-type field control layer 351 and the n-type field control layer 353, respectively. Any of the embodiments 300, 400 and 500 may have either one or both of the doping profiles 617 and 637. Specifically, each of the p-type field control layer 351 and the n-type field control layer 353 is divided into an edge region that is located closer to the optical waveguide 113 and farther away from the center line 106, as well as a central region that is located farther away from the optical waveguide 113 and closer to the center line 106. As shown in FIG. 6, the p-type field control layer 351 has an edge region 615 and a central region 616. Also, the n-type field control layer 353 has an edge region 635 and a central region 636. The edge region 615 may be doped differently than the central region 616, and the edge region 635 may be doped differently than the central region 636. The edge region 615 and the central region 616 are doped according to the doping profile 617, whereas the edge region 635 and the central region 636 are doped according to the doping profile 637. For instance, the edge region 615 may be doped at a doping concentration higher than that of the central region 616, with a gradual transition in the doping concentration moving from the edge region 615 to the central region 616. On the other hand, the edge region 635 may be doped at a doping concentration lower than that of the central region 636, with a gradual transition in the doping concentration moving from the edge region 635 to the central region 636. For example, the doping profile 617 may transition from 1e17-3e18 $cm^{-3}$ in the edge region 615 to 8e16-2e18 $cm^{-3}$ in the central region 616. Similarly, the doping profile 637 may transition from 5e14-5e16 $cm^{-3}$ in the edge region 635 to 2e17-5e18 $cm^{-3}$ in the central region 636. In some embodiments, the edge region 635 may be undoped. That is, the edge region 635 may comprise intrinsic silicon.

Figure 7:
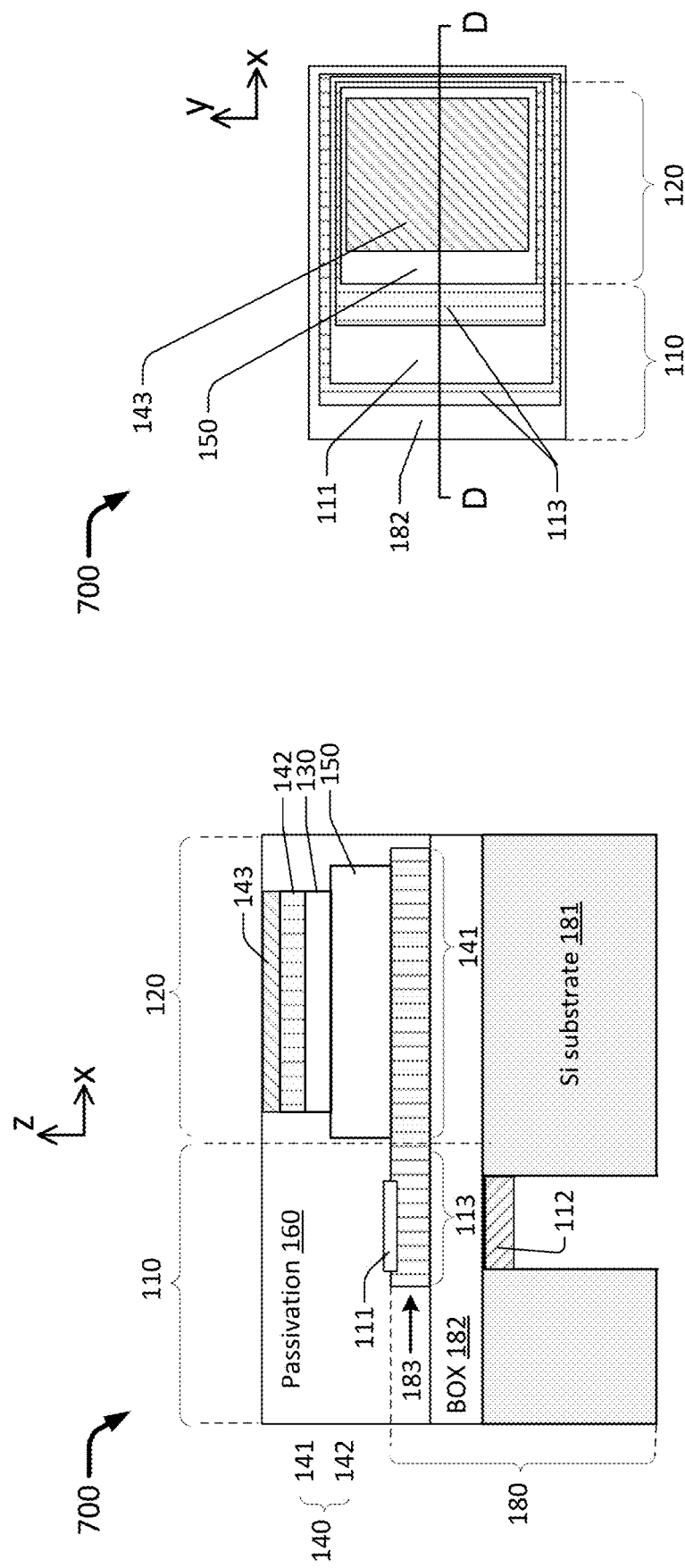
FIG. 7 illustrates a cross-sectional view and a top view of a monolithic APD in accordance with still another embodiment of the present disclosure.

In some embodiment, an APD may not have a symmetrical geometry with respect to a center line, such as the center line 106, that is in parallel with the vertical direction. Namely, unlike the APD 100, an APD may not have the optical coupler 111 and the waveguide 113 in all directions on a plane perpendicular to the vertical direction. FIG. 7 illustrates a cross-sectional view 710 and a top view 720 of an APD 700. The cross-sectional view 710 reveals a cross section of the APD 700 along line D-D in the top view 720. The top view 720 is in parallel with the x-y plane, whereas the cross-sectional view 710 is in parallel with the x-z plane. Same as the APD 100, the vertical direction of the APD 700 is also along the z-axis, as the APD 700 is configured to receive an incident light that comes along the z-axis. Same as in the top views 210 and 220, the passivation 160 is not shown in the top view 720 for illustration purposes.

The difference between the APD 700 and the APD 100 resides in that the optical coupler 111 and the waveguide 113 is located laterally to the active region 120 on only one side of the active region 120. As shown in FIG. 7, the APD 700 is not symmetrical in the x-z plane at least along the line D-D. For example, in the cross-sectional view 710, the optical zone 110 is located on one side of the optoelectrical zone 120, but not on the other side. Compared with the APD 100, the APD 700 has a smaller footprint in at least the x-y plane, which is suitable for a device packaging having a small form factor.

Various embodiments described herein provide technical advantages that enable an APD with low coupling loss and low leakage current, in particular an APD fabricated on a SOI substrate. Specifically, the employment of an optical reflector, such as the optical reflector 112, helps to reduce the coupling loss. Plus, the employment of silicon dioxide as passivation, such as the passivation 160, to cover a sidewall of the epitaxial structure 150 helps to reduce the leakage current. The lower coupling loss and the lower leakage current result in a higher responsivity of the APD, a key component in contemporary high-speed optical communication systems.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A monolithic avalanche photodiode (APD) configured to receive an incident light arriving at the monolithic APD along a vertical direction, the monolithic APD comprising:
    an optical coupler capable of receiving the incident light;
    an optical reflector disposed below the optical coupler, the optical reflector capable of reflecting at least a portion of the incident light to the optical coupler;
    an active region, comprising:
        an absorption layer;
        an epitaxial structure; and
        a pair of electrical conductors; and
    an optical waveguide extending along a horizontal plane that is substantially orthogonal to the vertical direction, the optical waveguide configured to guide the incident light received by the optical coupler to travel along the horizontal plane towards the active region,
    wherein:
        the absorption layer is capable of converting the incident light into a photocurrent,
        the epitaxial structure is capable of amplifying the photocurrent into an amplified photocurrent by avalanche multiplication,
        the pair of electrical conductors is capable of conducting the amplified photocurrent,
        the active region is disposed lateral to the optical waveguide along a horizontal direction substantially orthogonal to the vertical direction,
        the epitaxial structure comprises a p-type field control layer, a n-type field control layer and an intrinsic multiplication layer disposed between the p-type field control layer and the n-type field control layer, each of the p-type field control layer and the n-type field control layer comprises a respective edge region located closer to the optical waveguide and a respective central region located farther away from the optical waveguide, the p-type field control layer is doped less heavily in the central region as compared to the edge region thereof, and the n-type field control layer is doped more heavily in the central region as compared to the edge region thereof.

2. The monolithic APD of claim 1, wherein the optical reflector comprises aluminum (Al), copper (Cu), aluminum-copper (AlCu) alloy, or other reflective material compatible to a complementary-metal-oxide-semiconductor (CMOS) fabrication process.

3. The monolithic APD of claim 1, wherein the absorption layer comprises intrinsic germanium (Ge), silicon-germanium (SiGe) alloy or silicon-germanium-carbon (SiGeC) alloy.

4. The monolithic APD of claim 1, wherein:
the optical waveguide has an upper surface and a lower surface, the upper surface facing the incident light, the lower surface opposing the upper surface,
the optical coupler is integrally formed on the upper surface of the optical waveguide,
the optical reflector is disposed below the lower surface of the optical waveguide,
the incident light arrives at the optical coupler substantially along the vertical direction.

5. The monolithic APD of claim 4, wherein:
the absorption layer is adjacent to the epitaxial structure in the vertical direction,
the intrinsic multiplication layer, the p-type field control layer and the n-type field control layer disposed adjacent to each other in the vertical direction and each extending along the horizontal plane, and
the pair of electrical conductors comprises a p+ contact layer and a n+ contact layer each extending along the horizontal plane, the absorption layer and the epitaxial structure being disposed between the p+ contact layer and the n+ contact layer.

6. The monolithic APD of claim 5, wherein the absorption layer has a thickness in the vertical direction in a range of 100-700 nanometers (nm) and comprises intrinsic germanium (Ge) having a carrier concentration in a range of 5e14-5e16 per cubic centimeter ($cm^{-3}$).

7. The monolithic APD of claim 5, wherein the monolithic APD is fabricated on a silicon-on-insulator (SOI) substrate, the SOI substrate comprising a bulk silicon substrate, a buried oxide (BOX) layer disposed on top of the bulk silicon substrate, and a top silicon layer disposed on top of the BOX layer.

8. The monolithic APD of claim 7, wherein optical reflector is separated from the lower surface of the optical waveguide by the BOX layer.

9. The monolithic APD of claim 7, wherein:
the n+ contact layer is formed in the top silicon layer in a region doped by a n-type dopant and disposed adjacent to the n-type field control layer,
the p+ contact layer comprises amorphous silicon doped by a p-type dopant and is disposed adjacent to the absorption layer, and
the absorption layer is disposed adjacent to the p-type field control layer.

10. The monolithic APD of claim 9, wherein:
the n+ contact layer has a thickness in a range of 150-400 nanometers (nm) and comprises silicon (Si) doped by a n-type dopant having a doping concentration in a range of 5e18-5e19 per cubic centimeter ($cm^{-3}$),
the p+ contact layer has a thickness in a range of 50-200 nm and comprises amorphous silicon doped by a p-type dopant having a doping concentration in a range of 5e18-5e19 $cm^{-3}$,
the n-type dopant comprises arsenic (As) or phosphorus (P), and
the p-type dopant comprises boron (B).

11. The monolithic APD of claim 7, wherein:
the p+ contact layer is formed in the top silicon layer in a region doped by a p-type dopant and disposed adjacent to the p-type field control layer,
the n+ contact layer comprises amorphous silicon doped by a n-type dopant and is disposed adjacent to the absorption layer, and
the absorption layer is disposed adjacent to the n-type field control layer.

12. The monolithic APD of claim 11, wherein:
the p+ contact layer has a thickness in a range of 150-400 nanometers (nm) and comprises silicon (Si) doped by a p-type dopant having a doping concentration in a range of 5e18-5e19 per cubic centimeter ($cm^{-3}$),
the n+ contact layer has a thickness in a range of 50-200 nm and comprises amorphous silicon doped by a n-type dopant having a doping concentration in a range of 5e18-5e19 $cm^{-3}$,
the n-type dopant comprises arsenic (As) or phosphorus (P), and
the p-type dopant comprises boron (B).

13. The monolithic APD of claim 7, wherein the BOX layer has a thickness in a range of 1000-4000 nanometers (nm).

14. The monolithic APD of claim 7, wherein the optical waveguide is formed in the top silicon layer, and wherein the optical coupler comprises an optical grating having a pitch in a range of 50-500 nm and a depth in a range of 20-200 nanometers (nm).

15. The monolithic APD of claim 14, the epitaxial structure having a sidewall extending in the vertical direction, the monolithic APD further comprising:
a passivation covering at least the upper surface of the optical waveguide and the sidewall of the epitaxial structure,
wherein the passivation comprises silicon dioxide.

16. The monolithic APD of claim 7, wherein the optical waveguide has a thickness substantially equal to a sum of a thickness of the top silicon layer and a thickness of the epitaxial structure, and wherein the optical coupler comprises an optical grating having a pitch in a range of 200-1000 nm and a depth in a range of 50-500 nanometers (nm).

17. The monolithic APD of claim 16, the absorption layer having a sidewall extending in the vertical direction, the monolithic APD further comprising:
a passivation covering at least the upper surface of the optical waveguide and the sidewall of the absorption layer,
wherein the passivation comprises silicon dioxide.

18. The monolithic APD of claim 7, wherein the optical waveguide has a thickness between a first thickness and a second thickness, wherein the first thickness is a thickness of the top silicon layer, and wherein the second thickness equals to a sum of the first thickness and a thickness of the epitaxial structure.

19. The monolithic APD of claim 5,
wherein:
- the n-type field control layer has a thickness in a range of 100-400 nanometers (nm) and comprises silicon (Si) doped by a n-type dopant, the edge region thereof having a doping concentration in a range of 5e14-5e16 per cubic centimeter ($cm^{-3}$), the central region thereof having a doping concentration in a range of 2e17-5e18 $cm^{-3}$,
- the p-type field control layer has a thickness in a range of 30-300 nm and comprises Si doped by a p-type dopant, the edge region thereof having a doping concentration in a range of 1e17-3e18 $cm^{-3}$, the central region thereof having a doping concentration in a range of 8e16-2e18 $cm^{-3}$,
- the intrinsic multiplication layer has a thickness in a range of 50-400 nm and comprises intrinsic Si having a carrier concentration in a range of 5e14-5e16 $cm^{-3}$,
- the n-type dopant comprises arsenic (As) or phosphorus (P), and
- the p-type dopant comprises boron (B).

* * * * *